(12) United States Patent
Curd et al.

(10) Patent No.: US 6,549,016 B1
(45) Date of Patent: Apr. 15, 2003

(54) NEGATIVE VOLTAGE DETECTOR

(75) Inventors: Derek R. Curd, Fremont, CA (US); Fariba Farahanchi, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/896,158

(22) Filed: Jun. 28, 2001

Related U.S. Application Data

(62) Division of application No. 09/374,473, filed on Aug. 13, 1999, now Pat. No. 6,278,327.

(51) Int. Cl.[7] .................. G01R 31/08; G01R 31/26; H03F 3/04
(52) U.S. Cl. .................. 324/522; 324/525; 324/765; 330/297
(58) Field of Search .................. 324/522, 133, 324/255, 433, 765, 769; 357/227, 253; 330/297, 307, 296, 277, 279, 129, 295; 379/93

(56) References Cited

U.S. PATENT DOCUMENTS

| | | | |
|---|---|---|---|
| 5,150,075 A | 9/1992 | Hietala eta l. | 330/279 |
| 5,537,038 A | 7/1996 | Ando | 324/253 |
| 5,625,323 A | 4/1997 | Tozawa | 330/277 |
| 5,760,652 A | 6/1998 | Maemura et al. | 330/297 |
| 5,999,455 A | 12/1999 | Lin et al. | 365/185.24 |
| 6,107,844 A | 8/2000 | Berg et al. | 327/110 |
| 6,278,327 B1 * | 8/2001 | Curd et al. | 257/227 |
| 6,400,228 B1 * | 6/2002 | Verbist et al. | 330/127 |

* cited by examiner

Primary Examiner—Christine Oda
Assistant Examiner—James Kerveros
(74) Attorney, Agent, or Firm—Jeanette S. Harms; John Kubodera; Edel M. Young

(57) ABSTRACT

A negative voltage detector including a resistor divider circuit is used to translate a negative voltage into a standard CMOS logic low or logic high value. The small area consumed by the negative voltage divider allows multiple device placement within a logic device without the consumption of much area on the logic device. Additionally, the multiple devices placed may detect different negative voltage thresholds with a simple tuning of device components.

1 Claim, 2 Drawing Sheets

NEGATIVE VOLTAGE DETECTOR

This is a divisional of Application Ser. No. 09/374,473, filed Aug. 13, 1999, now U.S. Pat. No. 6,278,327.

FIELD OF THE INVENTION

The present invention relates to integrated circuit devices, such as complex programmable logic devices. More specifically, the present invention relates to a circuit for the detection of negative voltages using standard CMOS devices and processes.

BACKGROUND OF THE INVENTION

Manufacturers of integrated circuits migrate to increasingly smaller geometries of semiconductor processing technologies in an attempt to reduce cost and improve product performance. Advances in processing technologies are typically accompanied by reductions in circuit element characteristics, such as channel length, metal pitch, diffusion spacing, and gate oxide thickness. However, as explained in detail below, these advances in processing technologies do not necessarily result in reductions of the voltage levels required by these integrated circuits.

Integrated circuits, such as Complex Programmable Logic Devices (CPLDs), typically contain one or more non-volatile memory arrays (e.g., EPROM, EEPROM, or Flash EPROM arrays) which are used to make connections, implement logic functions, and store the user-defined configuration of the logic device. A memory cell of a non-volatile memory array has an associated state which is defined by the threshold voltage of the memory cell. The threshold voltage of the memory cell is dependent on the amount of charge stored by the floating gate of the memory cell. The state of the memory cell is changed by altering this charge stored by the floating gate.

The alteration of charge stored by the floating gate is accomplished by applying high voltages across the terminals of the memory cell such that electrons are either transferred to or removed from the floating gate of the memory cell. High voltages are considered to be those voltages in excess of the supply voltage $V_{CC}$. When electrons are transferred to the floating gate, the effective threshold voltage of the memory cell is raised. A memory cell with a high threshold voltage, for purposes of this discussion, is said to be erased. This erasure may be accomplished by applying a large voltage delta across the control gate terminal and the source terminal (and well) of the memory cell. Conversely, when electrons are removed from the floating gate of the memory cell, the effective threshold voltage of the memory cell is lowered. A memory cell with a low threshold voltage, for purposes of this discussion, is said to be programmed. Programming may be accomplished by applying a large voltage delta across the control gate terminal and the drain terminal of the memory cell. In some cases, the voltage delta required to create this transfer of electrons can be 16 to 20 Volts or more. Thus, the programming and erasing of memory cells is a high voltage application.

To provide the high voltages to the memory cells, a CPLD requires some high voltage NMOS and PMOS circuit elements that are able to withstand these high voltages. High voltage circuit elements are those elements that are optimized for performance at voltages above the $V_{CC}$ power supply of the logic device to 12–14 Volts. High voltage circuit elements are typically manufactured with thicker gate oxides and longer channel lengths than low voltage circuit elements, among other differences, that make them suitable for use in circuits with high voltage applications.

To lessen the voltage requirements for high voltage circuit elements, some manufacturers have migrated to a positive and negative voltage scheme to program and erase memory cells. For example, if a 16 Volt delta is required across the control gate and drain to program a memory cell, the memory cell may receive a grounding voltage of 0 Volts applied to the control gate terminal and +16 Volts applied to the drain terminal. However, the same 16 Volt delta in the positive and negative voltage scheme may be accomplished by applying −8 Volts to the control gate terminal and applying +8 Volts to the drain terminal. Typically, in this scheme, different circuit elements transmit positive and negative voltages. Thus, a single high voltage circuit element only tolerates a portion (e.g., 8 Volts or −8 Volts) of the voltage (e.g., 16 Volts) required to program the memory cell. As a result, only the memory cell undergoing the operation is subjected to the full voltage differential.

Unfortunately, the use of negative high voltages makes the design of logic devices much more complicated. For classically trained integrated circuit designers, it is conceptually and logistically much easier to deal with positive voltages. The vast majority of digital integrated circuit designs are based on a $V_{CC}$ (the supply voltage level of 5 Volts, 3.3 Volts, etc.) and GND (the 0 Volt ground) scheme, which represent logic high and logic low levels, respectively. As a result, an issue arises as to how to "control" and "translate" the negative voltage levels into standard CMOS levels of $V_{CC}$ and GND for interpretation by the rest of the circuit elements in the logic device. For example, it may be necessary to determine when the negative high voltage has reached a certain level below GND, and to provide that information to a low voltage circuit element in the form of a standard CMOS logic level of $V_{CC}$ or GND. A circuit accomplishing this function is called a Negative Voltage Detector.

FIG. 1 is a schematic diagram of a conventional Negative Voltage Detector (NVD) 100. NVD 100 includes a reference voltage generator 101, a negative charge pump 102, and a comparator circuit 103.

The output voltage of reference voltage generator 101, $V_{REF}$, is regulated to a fixed negative reference voltage using a conventional method. Voltage $V_{REF}$ is provided to the positive input terminal of comparator circuit 103. The negative supply voltage, $V_{NN}$, is provided to the negative input terminal of comparator circuit 103. Note that voltage $V_{NN}$ is the voltage of interest, and that voltage $V_{REF}$ is the voltage to which voltage $V_{NN}$ will be compared. Comparator circuit 103 is supplied by the standard nominal supply voltage $V_{CC}$ (e.g., a logic high value) and GND (e.g., a logic low value) supply rails. Thus, the output voltage of comparator circuit 103, $V_{COMP}$, will be either a logic low or a logic high value, depending whether voltage $V_{NN}$ is more or less negative than voltage $V_{REF}$.

For example, when voltage $V_{NN}$ is less negative than voltage $V_{REF}$, the output voltage $V_{COMP}$ will have a logic low value. However, when voltage $V_{NN}$ is equal to or more negative than voltage $V_{REF}$, the output voltage $V_{COMP}$ will have a logic high value. In this way, a negative detection of voltage level $V_{NN}$ voltage level can be achieved and translated into a useable standard CMOS logic level.

Unfortunately, NVD 100 is very costly in terms of device area used. Charge pumps and comparators require many, often large, devices for implementation. If local detection of many different negative voltages is required around the logic device, then constraints on available area would prohibit this type of NVD.

It would be useful to provide a simple circuit for detecting a negative voltage level. In particular, it would be useful to provide an NVD that uses very few small devices that can be reproduced many times throughout the chip wherever local detection of a negative voltage level is required.

SUMMARY

Accordingly, the present invention provides a negative voltage detector that uses very few CMOS devices. In this manner, the negative voltage detector can be repeated many times over in the device with little or no impact on the area consumed by the device. Moreover, each of these repetitions of the circuit can be individually tuned to detect a different negative voltage level, so that the device provides flexibility without the increased area and complexity that was previously required.

BRIEF DESCRIPLION OF THE DRAWINGS

DETAILED DESCRIPTION OF THE DRAWINGS

Figure 1:
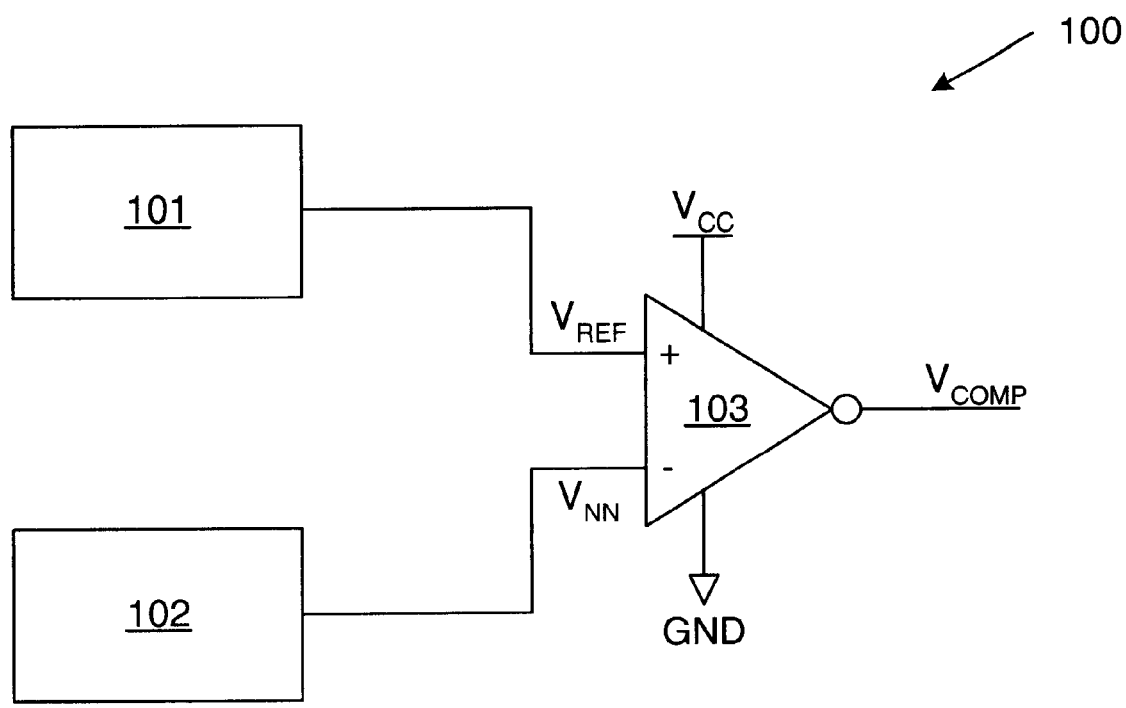
FIG. 1 is a schematic diagram of a conventional negative voltage detector.
Figure 2:
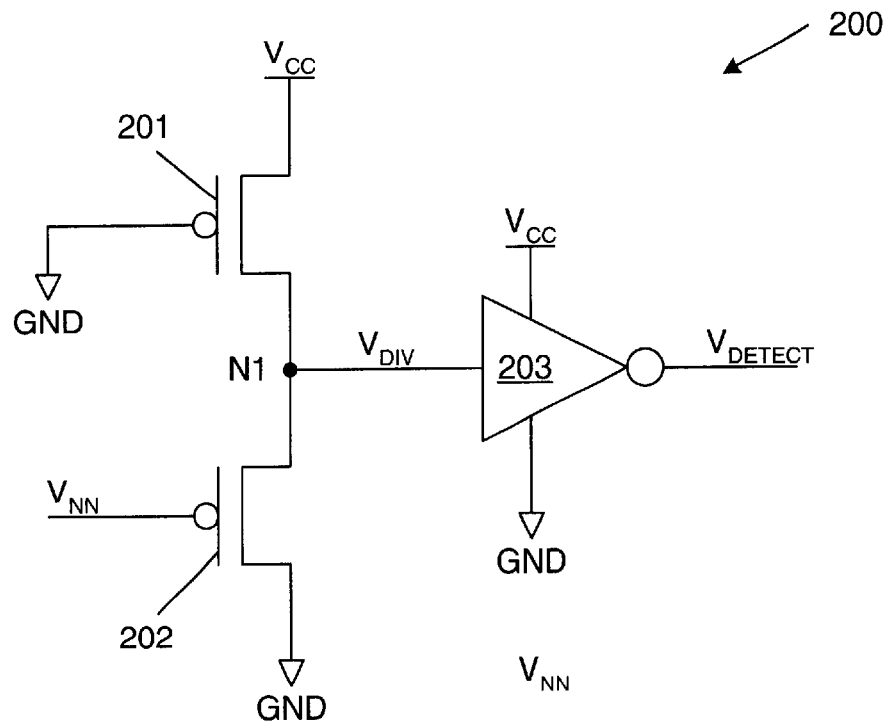
FIG. 2 is a schematic diagram of a negative voltage detector in accordance with one embodiment of the present invention.

FIG. 2 is a schematic diagram of a negative voltage detector 200 in accordance with one embodiment of the present invention. NVD 200 includes p-channel (i.e., PMOS) transistors 201–202 and an inverter 203. P-channel transistor 201 is coupled between supply voltage $V_{CC}$ and Node N1. The control gate of transistor 201 is coupled to GND. P-channel transistor 202 is coupled between Node N1 and GND. The control gate of transistor 202 is coupled to the negative supply voltage, $V_{NN}$. Node N1 is coupled to the input terminal of inverter 203. Inverter 203 is connected to the standard CMOS $V_{CC}$ and GND power rails. Therefore, voltage $V_{DETECT}$ produced by inverter 203 conforms to the standard logic high and logic low values used by standard low power CMOS circuits. Note that if very high negative voltages are to be detected, transistors 201–202 should be high voltage PMOS circuit elements.

NVD 200 operates as follows. P-channel transistors 201–202 are connected in series between $V_{CC}$ and GND. Transistor 201 is turned on because the control gate of transistor 201 is permanently tied to GND. Thus, transistor 201 will attempt to pull up the voltage at node N1, $V_{DIV}$. The voltage to be detected (i.e., $V_{NN}$) is provided to the control gate of transistor 202. voltage $V_{NN}$ determines how much transistor 202 is turned on. The more 'on' a transistor, the less resistance is provided by the transistor. As a result, transistors 201–202 effectively create a type of resistive divider in which the voltage level of $V_{DIV}$ will range between $V_{CC}$ and GND, as determined by the relative strength of transistors 201–202.

For example, if negative voltage supply $V_{NN}$ initially is equal to a voltage of 0 Volts, then both transistors 201–202 will be turned on. Transistor 201 will attempt to pull voltage $V_{DIV}$ up to the supply voltage $V_{CC}$, and transistor 202 will attempt to pull voltage $V_{DIV}$ down to GND. The resultant voltage $V_{DIV}$ will be determined by the relative strength (i.e., resistance) of transistors 201–202. The width to length ratio of a transistor determines the effective on channel resistance of that transistor. The width and length of transistors 201–202 is chosen by the manufacturer to determine the on channel resistance of transistors 201–202. A given resistance ratio between transistors 201–202 produces a desired voltage $V_{DIV}$ for a given voltage $V_{NN}$. Note that if the resistance of each of transistors 201–202 is proportionally increased, these transistors will also consume less power. In this way, the width and length of transistors 201–201 also may be chosen to minimize the DC power consumption of NVD 200. The design of the circuit is such that voltage $V_{DIV}$ is above the trip point of inverter 203 when negative supply voltage $V_{NN}$ is above the desired detection voltage. Therefore, the resistance ratio of transistor 201 to transistor 202 is set such that voltage $V_{DIV}$ is above the trip point of inverter 203 when negative supply voltage $V_{NN}$ is less negative than the desired detection voltage. Thus, when voltage $V_{NN}$ is at a voltage of 0 Volts, the resultant voltage $V_{DIV}$ at node N1 is greater than the trip point of inverter 203, thereby providing a logic high value to inverter 203. As a result, inverter 203 produces a logic low value as an output voltage $V_{DETECT}$.

As voltage $V_{NN}$ becomes more negative, transistor 202 is turned on stronger, thereby providing less resistance. This lessening of the resistance provided by transistor 202 causes voltage $V_{DIV}$ at node N1 to drop. Eventually, voltage $V_{NN}$ will reach a given negative level at which point voltage $V_{DIV}$ will be equal to or less than the trip point of inverter 203. Thus, what is considered to be a logic low voltage is provided to inverter 203. As a result, inverter 203 produces a logic high value as output voltage $V_{DETECT}$. In this manner, the present invention detects a given negative voltage level of $V_{NN}$ and translates that negative voltage level into a standard CMOS logic level for use by other standard CMOS low power circuit elements in the logic device. The ratio of the resistances of transistor 201 to transistor 202 as well as the trip point of inverter 203 precisely determine the voltage level of $V_{NN}$ at which NVD 200 will detect the negative voltage.

The time at which the voltage level of $V_{NN}$ reaches a certain level may be dependent on many things, including operating conditions ($V_{CC}$, temperature, etc.) of the logic device. The detection of a certain voltage level of $V_{NN}$ is especially important if an on-chip negative charge pump is used to create the negative voltage level. Due to time requirements, it is best to detect the instant at which the desired negative voltage level is reached, thus creating self-timed control of the associated circuits. By tuning NVD 200 as described above, a precise reference level of the voltage $V_{NN}$ may be detected for the given operating and process conditions.

Figure 3:
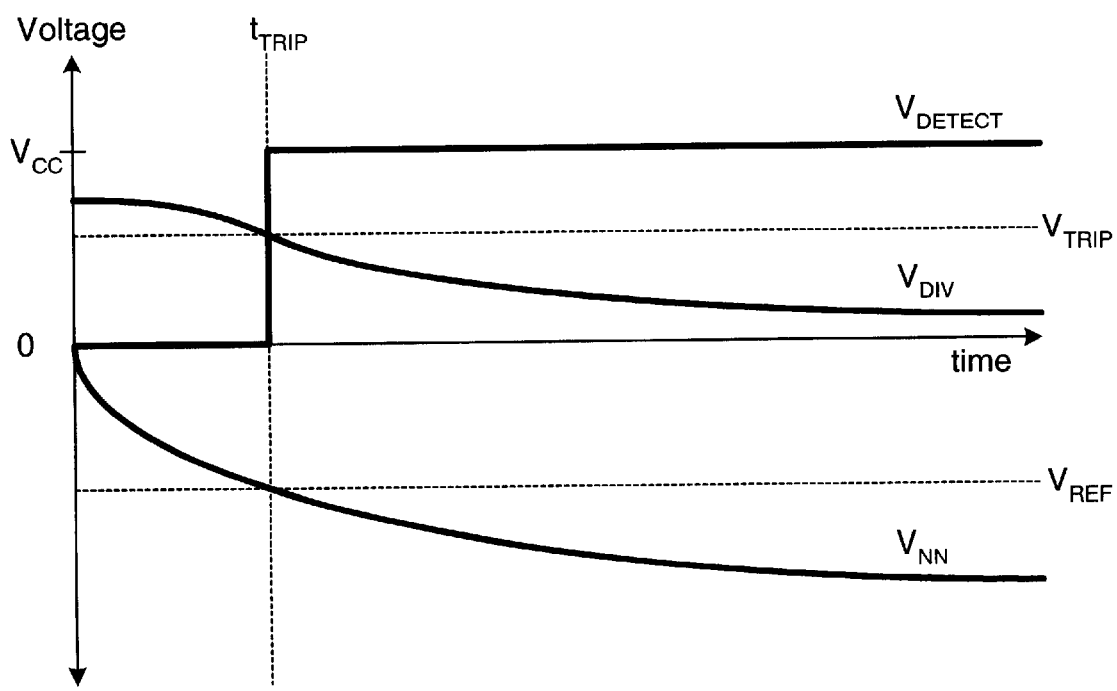
FIG. 3 is a timing diagram of a negative voltage detector in accordance with the embodiment of FIG. 2.

FIG. 3 is a timing diagram for NVD 200. FIG. 3 includes plots of voltage $V_{NN}$, voltage $V_{DIV}$, and voltage $V_{DETECT}$ over time. The dashed line labeled $V_{TRIP}$ represents the trip point of inverter 203. The dashed line labeled $V_{REF}$ represents the negative reference voltage of interest. The dashed line labeled $t_{TRIP}$ represents the time at which inverter 203 changes state.

Note that, as stated above, when voltage $V_{NN}$ is initially equal to GND, resultant voltage $V_{DIV}$ is below supply voltage $V_{CC}$ but above the trip point $V_{TRIP}$ of inverter 203. As a result, output voltage $V_{DETECT}$ of inverter 203 is a logic low value. As voltage $V_{NN}$ becomes more negative, transistor 202 turns on stronger, thereby lowering the voltage $V_{DIV}$ at node N1. At time $t_{TRIP}$, voltage $V_{NN}$ is equal to negative reference voltage $V_{REF}$ and voltage $V_{DIV}$ reaches the trip point $V_{TRIP}$ for inverter 203. As a result, output voltage $V_{DETECT}$ of inverter 203 changes to a logic high value. Therefore, NVD 200 has been properly tuned to detect voltage $V_{NN}$ at the voltage $V_{REF}$ level, and represent that detection as a logic high output voltage $V_{DETECT}$.

As can be seen from FIG. 2, the present invention uses very few CMOS devices. There are four CMOS devices used, including those comprising inverter 203. Therefore, NVD 200 uses many fewer devices than is used by conventional NVD 100. As a result, NVD 200 may be replicated many times within a logic device with little impact on the area consumed. Because each duplication of NVD 200 may be individually tuned (i.e., alteration of the ratio of component transistor resistances and trip point of inverter) to detect a different negative voltage level, this invention also offers flexibility without the larger area and complexity required by conventional NVD 100.

Although the present invention has been described in connection with several embodiments, it is understood that this invention is not limited to the embodiments disclosed, but is capable of various modifications which would be apparent to one of ordinary skill in the art. For example, the control gate of transistor 201 may be coupled to a reference voltage instead of ground. Thus, the invention is limited only by the following claims.

We claim:

1. A method of detecting a negative voltage, the method comprising:

forming a resistive divider structure having a first resistive element, a second resistive element, a control terminal coupled to the second resistive element, a reference terminal coupled to the first resistive element, and an output terminal coupled between the first resistive element and the second resistive element;

coupling the reference terminal to a reference voltage to control a first resistance of the first resistive element;

coupling the control terminal to a negative voltage supply source to control a second resistance of the second resistive element; and coupling an input terminal of an inverter to the output terminal of the resistive divider structure.

\* \* \* \* \*